(12) United States Patent
Wang et al.

(10) Patent No.: US 12,228,771 B2
(45) Date of Patent: Feb. 18, 2025

(54) APPARATUS, SYSTEM, AND METHOD OF PROVIDING A TRAY FOR HOLDING AN OPTOELECTRONIC DEVICE DURING PRINTED CIRCUIT BOARD MANUFACTURING

(71) Applicant: JABIL INC., St. Petersburg, FL (US)

(72) Inventors: Wenlu Wang, St. Petersburg, FL (US); Marcel Moortgat, St. Petersburg, FL (US)

(73) Assignee: JABIL INC.

( * ) Notice: Subject to any disclaimer, the term of this patent is extended or adjusted under 35 U.S.C. 154(b) by 932 days.

(21) Appl. No.: 17/270,799

(22) PCT Filed: Sep. 4, 2018

(86) PCT No.: PCT/US2018/049353
§ 371 (c)(1),
(2) Date: Feb. 23, 2021

(87) PCT Pub. No.: WO2020/050817
PCT Pub. Date: Mar. 12, 2020

(65) Prior Publication Data
US 2021/0345531 A1 Nov. 4, 2021

(51) Int. Cl.
*G02B 6/36* (2006.01)
*H05K 3/24* (2006.01)
(Continued)

(52) U.S. Cl.
CPC .......... *G02B 6/3616* (2013.01); *H05K 3/341* (2013.01); *H05K 13/0404* (2013.01); *G02B 6/444* (2013.01); *H05K 13/0084* (2013.01)

(58) Field of Classification Search
None
See application file for complete search history.

(56) References Cited

U.S. PATENT DOCUMENTS 6,144,792 A    11/2000  Kim et al.
6,795,633 B2 *  9/2004  Joseph, II ............ G02B 6/4457
                                               385/137
(Continued)

FOREIGN PATENT DOCUMENTS

CN    1181512    5/1998
CN    1194770    9/1998
(Continued)

OTHER PUBLICATIONS

International Search Report for PCT/US2018/049353, dated May 14, 2020.
(Continued)

*Primary Examiner* — Jerry Rahll
(74) *Attorney, Agent, or Firm* — Riverside Law LLP (57) ABSTRACT

An apparatus, system and method of providing a tray suitable for holding an optoelectronic device during printed circuit board manufacturing processes. The apparatus, system and method includes a tray body having an inset for receiving the optoelectronic device; a plurality of positioners for the optoelectronic device within the inset; and a guide channel about a perimeter of the tray body suitable for receiving optical fibers of the optoelectronic device when the optoelectronic device is received in the inset, the guide channel comprising at least one retainer for retaining received ones of the optical fibers therewithin.

20 Claims, 13 Drawing Sheets (51) Int. Cl.
*H05K 3/34* (2006.01)
*H05K 13/04* (2006.01)
*G02B 6/44* (2006.01)
*H05K 13/00* (2006.01)

(56) References Cited

U.S. PATENT DOCUMENTS

2004/0135595 A1 7/2004 Chen
2016/0124164 A1 5/2016 Doerr
2017/0179103 A1 6/2017 Aleksov

FOREIGN PATENT DOCUMENTS

| CN | 201348664 Y | 11/2009 |
| CN | 102687049 | 9/2012 |
| CN | 202524655 | 11/2012 |
| CN | 103003732 | 3/2013 |
| CN | 106862760 | 6/2017 |
| EP | 0795767 | 9/1997 |
| EP | 2851724 | 3/2015 |
| GB | 2318648 | 4/1998 |
| JP | 2001119163 A | 4/2001 |
| JP | 2009198603 | 9/2009 |
| JP | 2010098320 | 4/2010 |
| JP | 2011033917 | 2/2011 |
| WO | 9308595 | 4/1993 |

OTHER PUBLICATIONS

Written Opinion of the International Searching Authority for PCT/US2018/049353, dated May 14, 2020.
International Preliminary Report on Patentability for PCT/US2018/049353, dated Mar. 9, 2021.

\* cited by examiner

APPARATUS, SYSTEM, AND METHOD OF PROVIDING A TRAY FOR HOLDING AN OPTOELECTRONIC DEVICE DURING PRINTED CIRCUIT BOARD MANUFACTURING

CROSS-REFERENCE TO RELATED APPLICATION

This application is a national stage application of International Patent Application No. PCT/US2018/049353, filed Sep. 4, 2018, entitled: APPARATUS, SYSTEM, AND METHOD OF PROVIDING A TRAY FOR HOLDING AN OPTOELECTRONIC DEVICE DURING PRINTED CIRCUIT BOARD MANUFACTURING, the entirety of which is incorporated herein by reference as if set forth in its entirety.

BACKGROUND

Field of the Disclosure

The disclosure relates generally to circuit board manufacturing, and, more particularly, to an apparatus, system, and method of providing a tray suitable for holding an optoelectronic device during printed circuit board manufacturing processes.

Background of the Disclosure

Optoelectronic devices are hardware devices that source, detect and control light to perform a given function in an electrical circuit. Such devices convert electrical signals into photon signals, and vice versa, and accordingly devices that act as electrical-to-optical or optical-to-electrical transducers are considered optoelectronic devices.

Optoelectronic devices often employ fiber optics to pass transduced signals between aspects of the electrical circuit in which the optoelectronic device resides. Because optoelectronics is based on the quantum mechanical effects of light on electronic materials, and particularly on semiconductors, optoelectronic devices are frequently subjected to the same processes as other semiconductor circuits, such as being placed onto printed circuit boards to reside in larger circuits having other components. Often, such placements of devices onto printed circuit boards employ surface mount technology (SMT) and pick and place methodologies.

As referenced, optoelectronic devices often have fiber optic lines associated therewith, and accordingly such fiber optic lines must be managed during SMT/pick and place processes. That is, dangling fibers enhance the difficulty for device attachment to a circuit board, and are easily damaged during soldering and/or SMT reflow processes. Thus improved methodologies of managing these dangling fibers are needed.

SUMMARY OF THE DISCLOSURE

The disclosure is and includes at least an apparatus, system and method of providing a tray suitable for holding an optoelectronic device during printed circuit board manufacturing processes. The apparatus, system and method may comprise a tray body having an inset for receiving the optoelectronic device; a plurality of positioners for the optoelectronic device within the inset; and a guide channel about a perimeter of the tray body suitable for receiving optical fibers of the optoelectronic device when the optoelectronic device is received in the inset, the guide channel comprising at least one retainer for retaining received ones of the optical fibers therewithin.

BRIEF DESCRIPTION OF THE DRAWINGS

The disclosure is illustrated by way of example and not limitation in the accompanying drawings, in which like references may indicate similar elements, and in which.

DETAILED DESCRIPTION

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

The terminology used herein is for the purpose of describing particular example embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. That is, terms such as "first," "second," and other numerical terms, when used herein, do not imply a sequence or order unless clearly indicated by the context. Thus, a first element, component, region, layer or section discussed below could be termed a second element, component, region, layer or section without departing from the teachings of the exemplary embodiments.

Processor-implemented modules, systems and methods of use may be disclosed herein that may provide access to and transformation of a plurality of types of digital content, including but not limited to video, image, text, audio, metadata, algorithms, interactive and document content, and which track, deliver, manipulate, transform, transceive and report the accessed content. Described embodiments of these modules, systems and methods, such as in the performance of pick and place algorithms, are intended to be exemplary and not limiting.

As mentioned above, optoelectronic devices often have fiber optic lines associated therewith, and thus such fiber optic lines must be managed during SMT/pick and place processes. That is, dangling fibers enhance the difficulty for device attachment onto a circuit board, and are easily damaged during soldering and/or SMT reflow processes, and thus must be managed during circuit board processing.

SMT reflow is a highly efficient way to attach SMT devices to a circuit board, as will be appreciated by the skilled artisan. However, as fiber interface numbers increase with the advancement of optoelectronic technology, such as for high speed coherent optical transceiver devices, by way of non-limiting example, the ball grid array (BGA) interfaces necessary for accommodating up to hundreds of electrical control signals and for transmitting and receiving high speed radio frequency signals, and for dealing with the fibers that correspond to many of those interfaces, become a limiting factor in circuit board processing.

Thus, to address the complexities of optoelectronic devices being picked and placed, and subjected to reflow processes, in the course of populating a circuit board, loose fibers must be managed properly. This management may be provided by fiber management methodologies, such as a holder or a tray that is physically associated with the optoelectronic device to be placed.

However, a fiber tray, when used in the known art, is generally manually attached to the optoelectronic device before a SMT reflow process, and is manually detached from the optoelectronic device after the SMT reflow process. Thus, the fiber tray must withstand SMT reflow and process temperatures, and must manage the fibers during the reflow process and/or other processes. This typically causes a substantial weight for such trays in the known art, which makes the trays unsuitable for use by automated pick and place machines. Further, the known art tray is inefficient at least in its need for manual attachment and detachment, typically using one or more screws.

Figure 1:
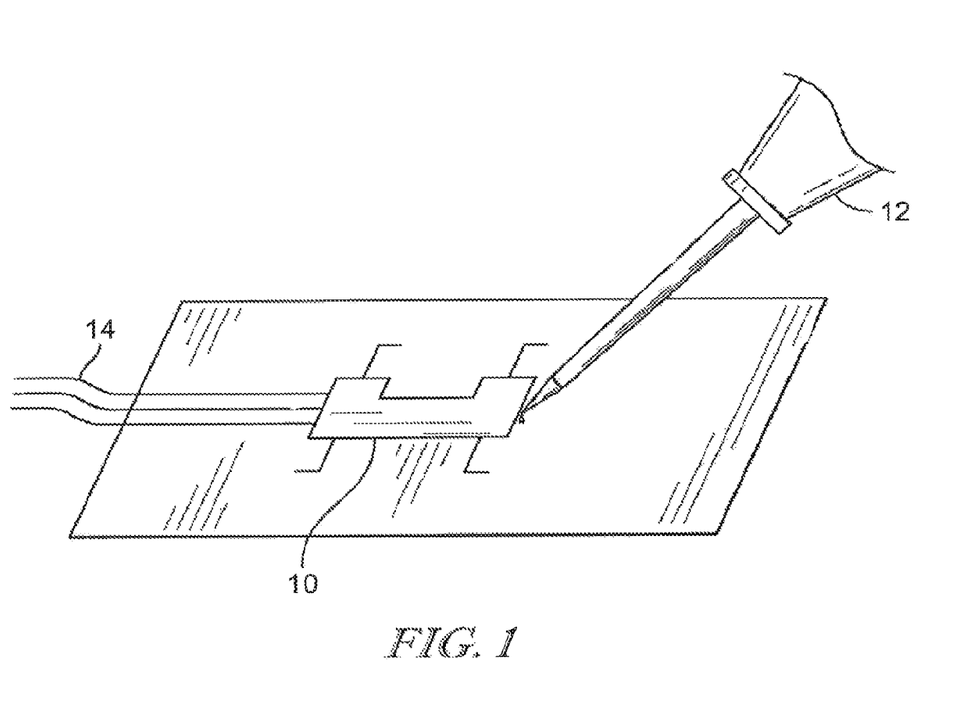
FIG. 1 illustrates an embodiment of the mounting of a SMT optoelectronic device.

In other examples, optoelectronic devices may be soldered onto a board by picking up the device, manually aligning the pin to its pad or hole, and then manually soldering the device pin to its respective pad or hole, all while manually looping the fibers to maintain them away from the soldering area. Such an example is illustrated in FIG. 1. More specifically, FIG. 1 illustrates the manual soldering of an optical device 10 using a soldering iron 12. The dangling fibers 14 are unmanaged in the example of FIG. 1.

With the proliferation of robotic and other automated processes for picking and placement of optoelectronic components, manually looping/managing fibers, and/or manual attachment of a tray to a device for processing, followed by manual detachment of the tray after processing, significantly impinges on process time and efficiency. Moreover, even if automated processes are employed in the known art, nakedly looped or unlooped fibers often tangle in the pickup toolhead, or are otherwise frequently damaged during the aforementioned processes.

Figure 2:
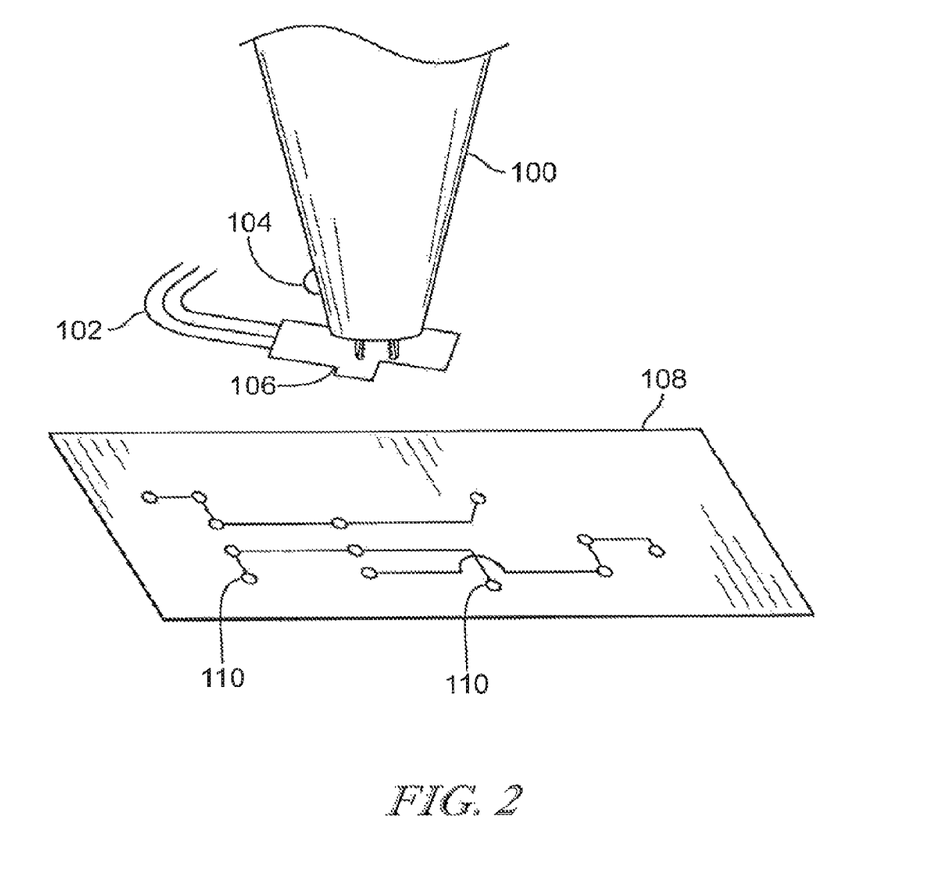
FIG. 2 illustrates an embodiment of the mounting of a SMT optoelectronic device.

In an additional example illustrated in FIG. 2, the optoelectronics device 106 may be picked up by an automated tool head 100 with the fibers 102 at least initially left to dangle. The fibers 102 then may or may not be temporarily attached 104 to the pickup tool head 100 for processing. If the fibers 102 are attached to the tool head 100, after placement of the device 106 onto the circuit board 108 the fibers 102 must then be manually removed from the pickup tool head 100. However, in such cases the forces exerted by the dangling fibers 102 may shift the optical device 106 from its pads 110 on the circuit board 108, or may shift, tilt, or otherwise misalign the optical device 106, thereby resulting in an unsuccessful attachment and, accordingly, decreased process yield.

More specifically, FIG. 2 illustrates an optical device 106 being picked and placed using the automated tool head 100. In the illustration shown, the optical fibers 106 are left unmanaged, as referenced above. Consequently, the fibers 102 of FIG. 2 are likely to interfere with the processes to which the tool head 100 subjects the optical device 106.

To the extent a fiber tray is used to manage the fibers during processing, handling of the fibers by the tray becomes a process issue. By way of example, screws may often be used to attach the fiber tray to the optical device and to guide the dangling fibers. In such cases, space must thereby be allotted for a screw hole or holes on the optoelectronic device, which is a highly inefficient use of device packaging space. Yet further, the manual screwing and unscrewing process is time consuming and inefficient, as referenced above.

In yet another example, a magnet may be used to attach a fiber tray to the body of the optical device. However, such a process may not be used if the optical device is made with metal. Furthermore, the magnet may attract other metal SMT components, such as resisters and capacitors, and may thus disturb the alignment and attachment of those other components.

To attach the fiber tray with a magnet also requires additional steps to place and remove the magnet. Such steps are not only time consuming and thus inefficient, but additionally further enhance the risks of misalignment, non-attachment, and/or short circuits, for example. Upon each occurrence of any of the foregoing, manufacturing cost is increased and yield is decreased.

Therefore, the disclosed SMT fiber management tray holds and protects dangling fibers without the use of a screw or a magnet. The disclosed tray readily manages fibers and attaches, either manually or automatically, to the optical device for manufacturing processes, such as by simple pressuring of the tray onto the device, and easily detaches, either manually or automatically, from the optical device, such as by inverting the attachment pressure.

The tray is lightweight and balanced to allow for pick and place and BGA reflow operations that include the tray with a device thereon, and comprises thermal properties that protect the fibers and the optical device during circuit board manufacturing, including during reflow. The tray is low cost and easily manufacturable. The tray may use springs, spring walls, frictional bumps, or the like, rather than screws or magnets, to maintain the device within the tray, and to also provide for ready detachment of the device from the tray. The tray protects and guides the fibers of the optical device during processing so that they do not get tangled, cut, or burned, for example.

More specifically, the increased integration of electrical components in a modern optical transceiver increases the number of electrical interfaces required, necessitates fine-pitched pins, and often employs a BGA-package. The foregoing are thus required to survive SMT reflow and not collapse or degrade during processing, so that connectivity is maintained, which requires that the fiber tray be easily attached and detached, survive the high temperatures of SMT reflow but not adversely affect the thermal dynamics of SMT reflow, and be lightweight and balanced so that the solder balls and connections will not collapse, short out, or be otherwise adversely affected.

That is, in typical processing, the solder to the board is provided in a BGA format; the device is picked and placed onto the board; the BGA solder is reflowed; the device-holding fiber tray is then removed; and the fibers are routed. In the embodiments, the loading of the device and/or the fibers into the tray may be manual or automated, as may be the removal of the tray during processing. Of note, particularly in automated embodiments, the removal force applied to the tray/device to remove the device from the tray must not exceed the maximum stress force of the reflowed solder in the process flow discussed above.

Figure 3A:
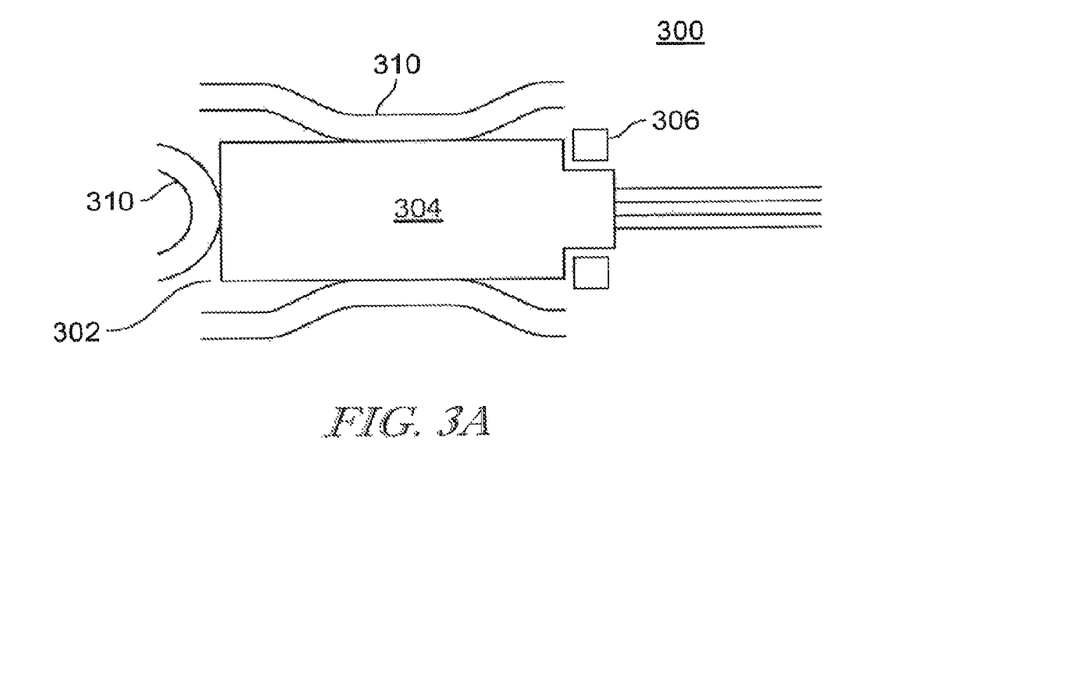
FIG. 3A illustrates embodiments of a SMT fiber management tray.
Figure 3B:
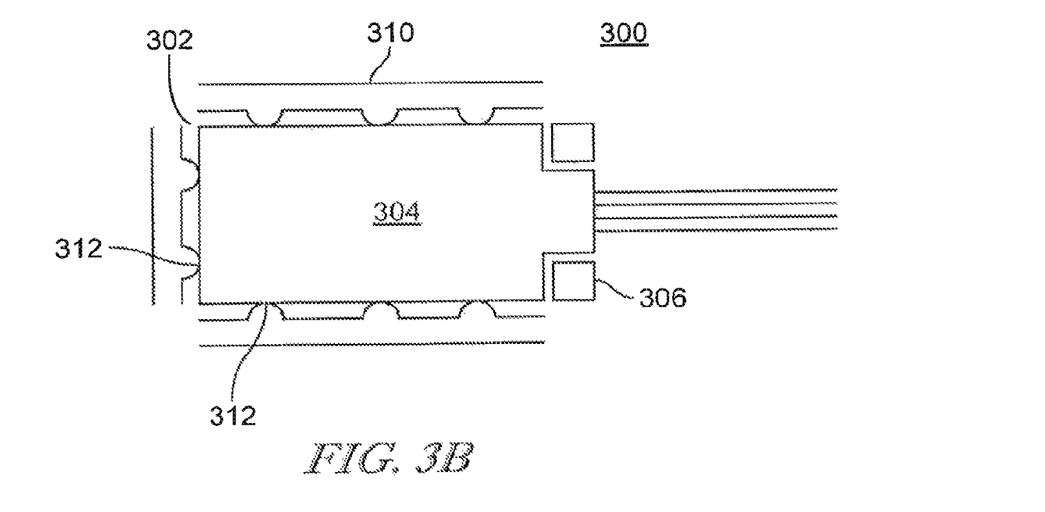
FIG. 3B illustrates embodiments of a SMT fiber management tray.

FIG. 3 show the underside of a fiber tray 300. In the illustration, the fiber tray 300 has a receiving inset 302 into which an optoelectronic device 304 is received. The inset 302 may include posts 306 corresponded to the inserted device 304. The posts 306 maintain the position of the device 304 within the inset 302.

Also illustrated in FIG. 3A are spring walls 310 that frictionally, using the spring constant of the walls, maintain the device within the inset with a force equal to the spring constant. Consequently, removal of the device from the inset requires only a force equal to overcome the spring force applied by the walls.

FIG. 3B illustrates micro bumps 312 formed on the walls of the inset. The micro bumps provide a frictional force that maintains the device within the inset. Consequently, removal of the device from the inset necessitates only that the frictional force of the micro bumps be overcome.

The walls 310 of FIG. 3 may, in some embodiments, minimize air flow within the inset, thereby minimizing the heat flow to which the device is subjected. Alternatively, the inset and/or the walls of the inset may include ventilation vents to allow air flow circulation around the device during processing.

Figure 4:
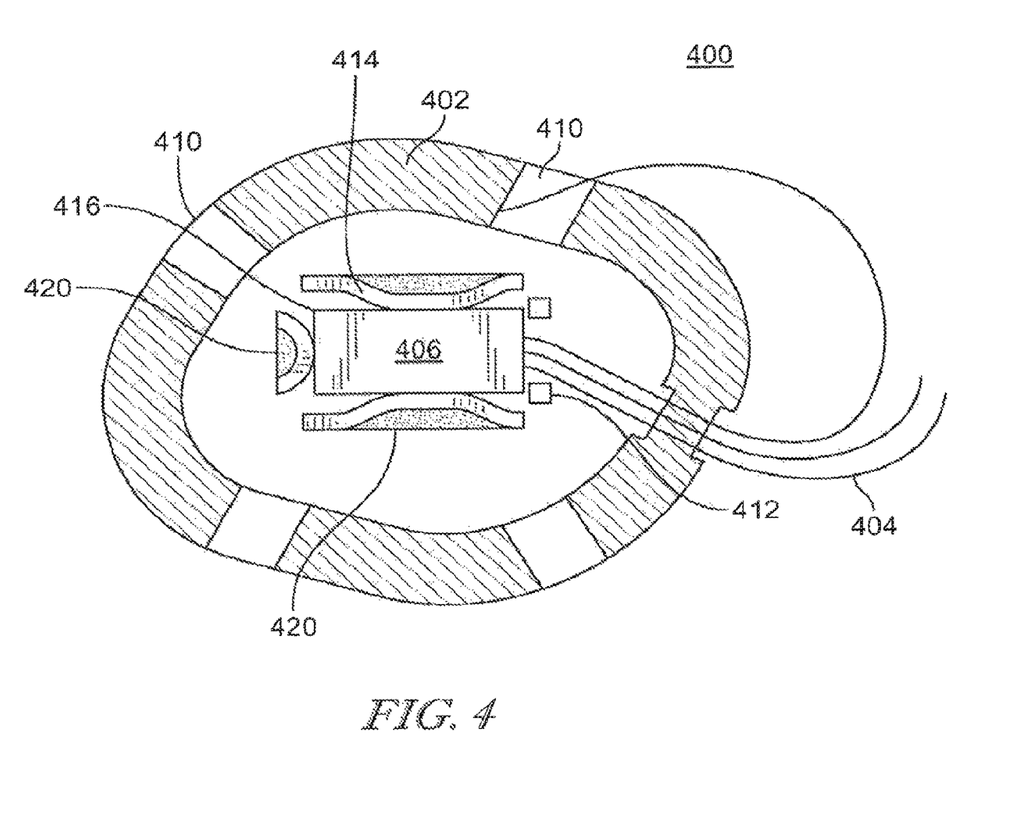
FIG. 4 illustrates an embodiment of a SMT fiber management tray.

FIG. 4 shows the top view of a fiber management tray 400. In the illustration, a fiber guide 402 is provided at the perimeter of the tray 400. Needless to say, maintenance of the fibers 404 in the fiber guide 402 during processing keeps the fibers 404 away from the high-heat location of the reflowing solder immediately under the device 406.

The fiber guide 402 may include one or more fiber entry points 410, which may allow for management of the fibers 404 such that the bending radius of inserted fibers 404 is maximized, thereby minimizing adverse effects on the fibers 404 during processing. Of note, although three fiber pigtails are looped into the guide 402 of the tray 400 in the illustration, it will be appreciated that more or fewer fibers 404 may be inserted, such as through the same or a different fiber entry points 410 to the guide 402.

In FIG. 4, posts 412 and spring walls 414 are provided in the inset 416 of the tray 400 in order to positionally maintain the device 406 within the inset. Additionally illustrated are one or more air circulation vents 420. These vents 420 may be provided in order to circulate hot air around the device 406 during processing.

Figure 5:
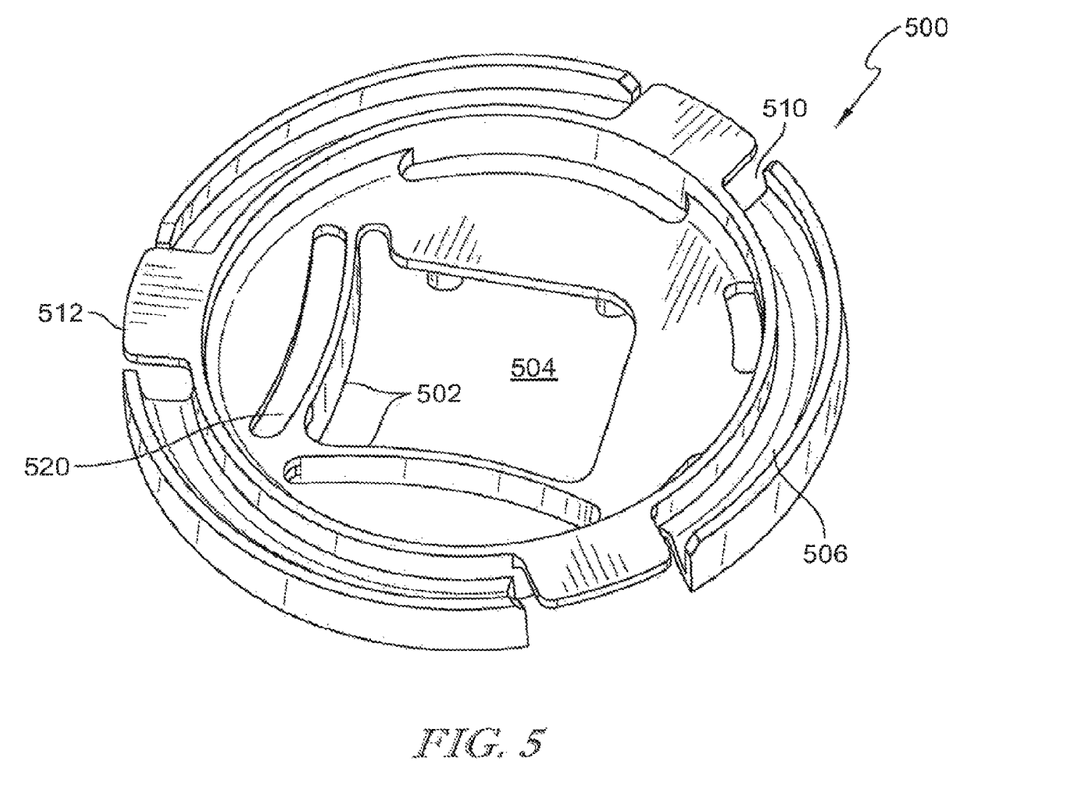
FIG. 5 illustrates an embodiment of a SMT fiber management tray.

FIG. 5 shows the perspective view of a fiber management tray 500. The illustrated tray 500 includes curved spring walls 502 within an inset 504 to maintain an inserted device (not shown). As such, the device may be easily inserted and removed from the tray 500, without the use of screws or magnets.

Also included in the illustrated embodiment is a perimeter fiber guide 506 with, by way of example, multiple fiber insertion points 510 and/or fiber channel openings, and three right angle clips 512 that maintain the fibers within the guide 506 along the perimeter. Of course, active rather than passive clips 512 may be included, and more or fewer than three clips 512 may be employed. Additionally illustrated are cutouts 520 for increasing hot air circulation and reducing air disturbance to the device during reflow. The fiber guide 506 may take the form of, for example, a three-walled channel.

The fiber tray discussed throughout may be formed of any suitable material to maintain a light weight and to withstand reflow temperatures. The makeup of the tray may be matched to the process(es) to which the optical device is to be subjected, i.e., the tray must withstand the temperatures that are applied by a given process, but needn't be over-engineered to withstand significantly worse conditions than those to which the device will be subjected. The tray may be uniform in its constitution, or may be formed in pieces having the same or different compositions. Thus, the fiber management tray may be machined, injection molded, and/or may be printed via additive manufacturing (such as 3D printing) and then machined and/or molded as needed. Thus, the manufacturing of the tray may be low cost, and the tray may be re-usable or recyclable.

By way of non-limiting example, the tray may be formed of photopolymer resin (FLHTAM01), or Ketron HPV Peek plastic. The material may have a thermal deflection point of 150 degrees C. to 375 degrees C., such as 289 degrees C. or 340 degrees C., post cure. The material may have a low thermal expansion coefficient, such as in the range of 50-125 ppm, and more specifically, such as 85-87.5 ppm. The tray may have a thermal conductivity of 0.10-1.5 W/(K·m), for example, such as 0.24 W/(K·m). The tray, when formed, may have a weight of 0.5-5.0 grams, such as 2.0 grams.

Figure 6:
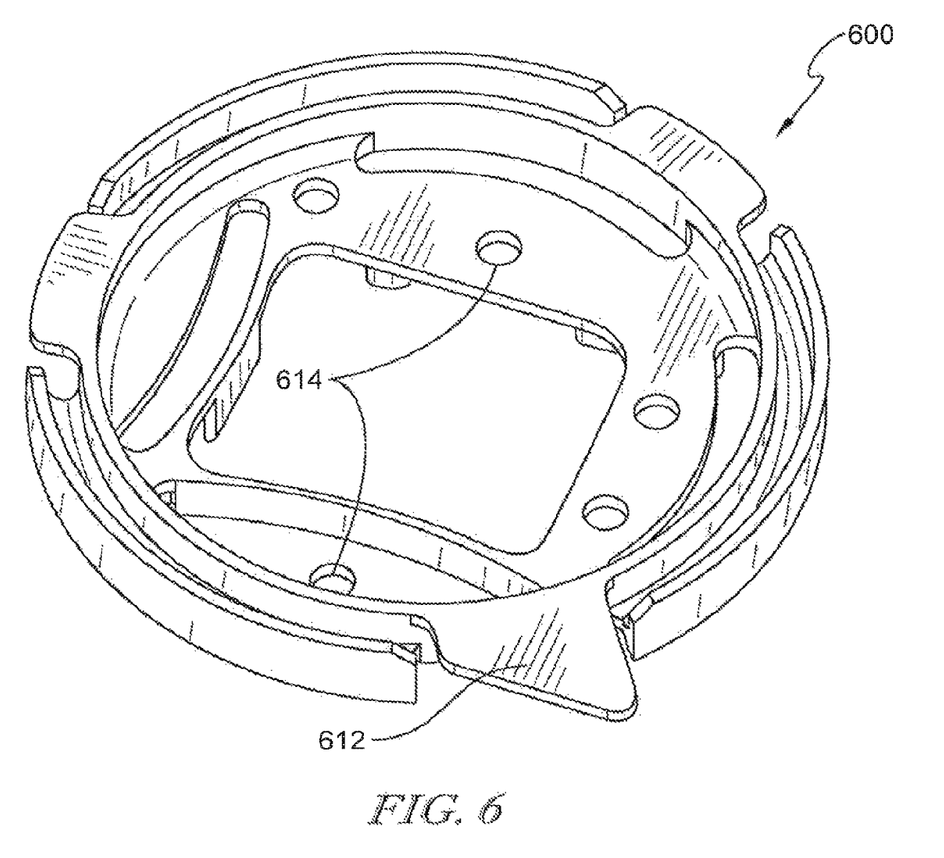
FIG. 6 illustrates an embodiment of a SMT fiber management tray.

In order to avoid the fiber undesirably releasing from the fiber guide, an extended clip 612 may be provided, such as that illustrated in the embodiment of FIG. 6. Needless to say, one or more of the clips 612 may be extended to enhance the ability of the guide to maintain all fibers therewithin. Also illustrated in FIG. 6 is a plurality of vent holes 614 to optimize air circulation and prevent damage to an inserted device. Such vent holes 614 also serve to further decrease the weight of the tray 600. For example, such holes 614 may allow for a decrease of tray weight into a range of 0.5 g-1.7 g, such as 1.2 g.

Figure 7:
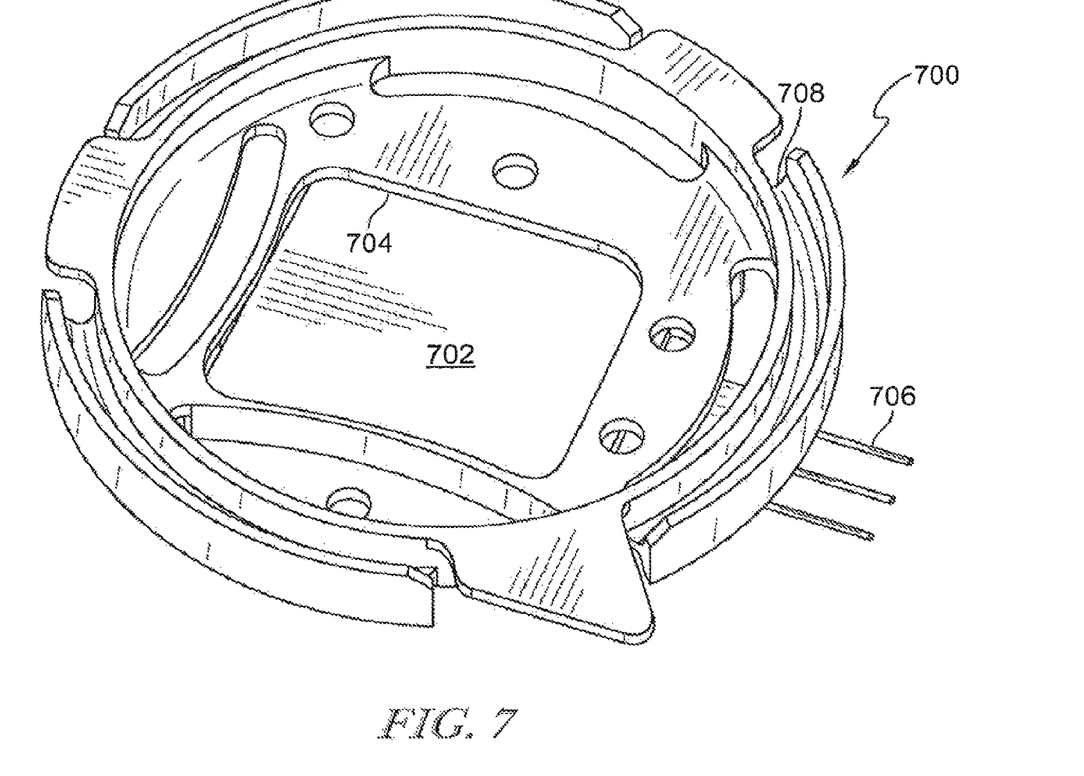
FIG. 7 illustrates an embodiment of a SMT fiber management tray.

FIG. 7 is a top view of a fiber management tray 700. In the illustration, a device 702 is inserted in the inset 704 of the tray 700, and the fibers 706 are maintained within the fiber guide 708 about the perimeter of the tray 700.

Figure 8:
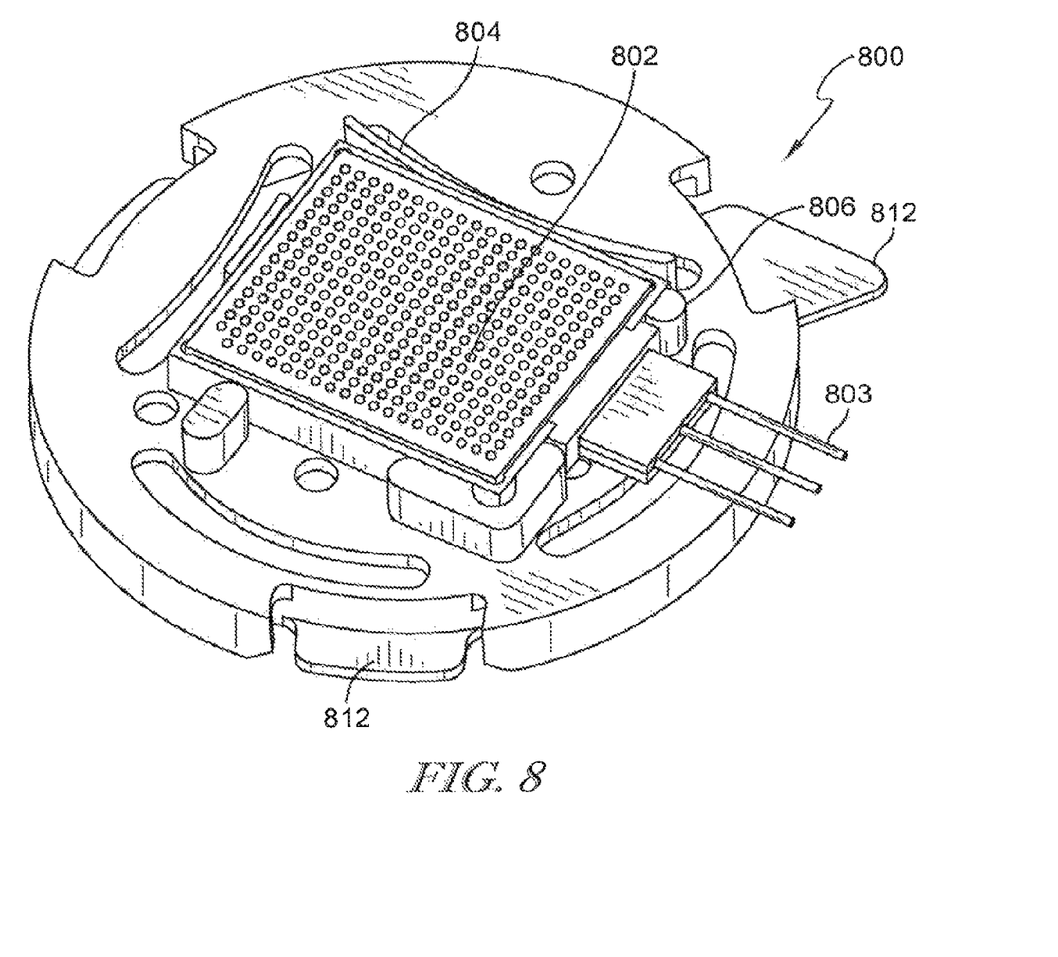
FIG. 8 illustrates an embodiment of an SMT fiber management tray.

FIG. 8 is a bottom view of a fiber management tray 800 holding an optoelectronic device 802 with fibers 803. The curved wall 804 acts as a spring wall in the illustration, the posts 806 act as stops to hold the device 802 in place, and the clips 812 may hold the fibers 803 in place once the fibers 803 are wrapped.

Figure 9A:
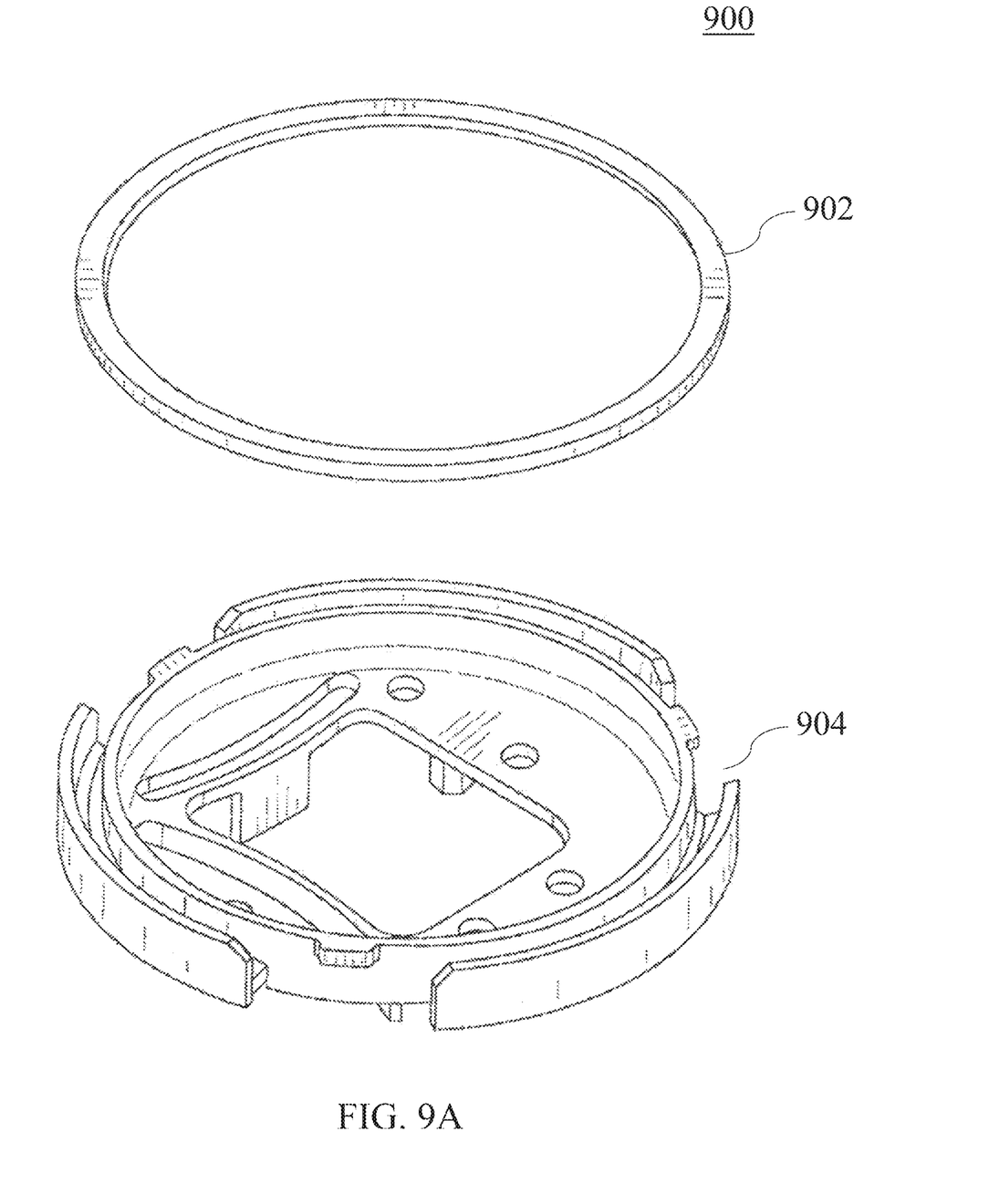
FIG. 9A illustrates an embodiment of an SMT fiber management tray.
Figure 9B:
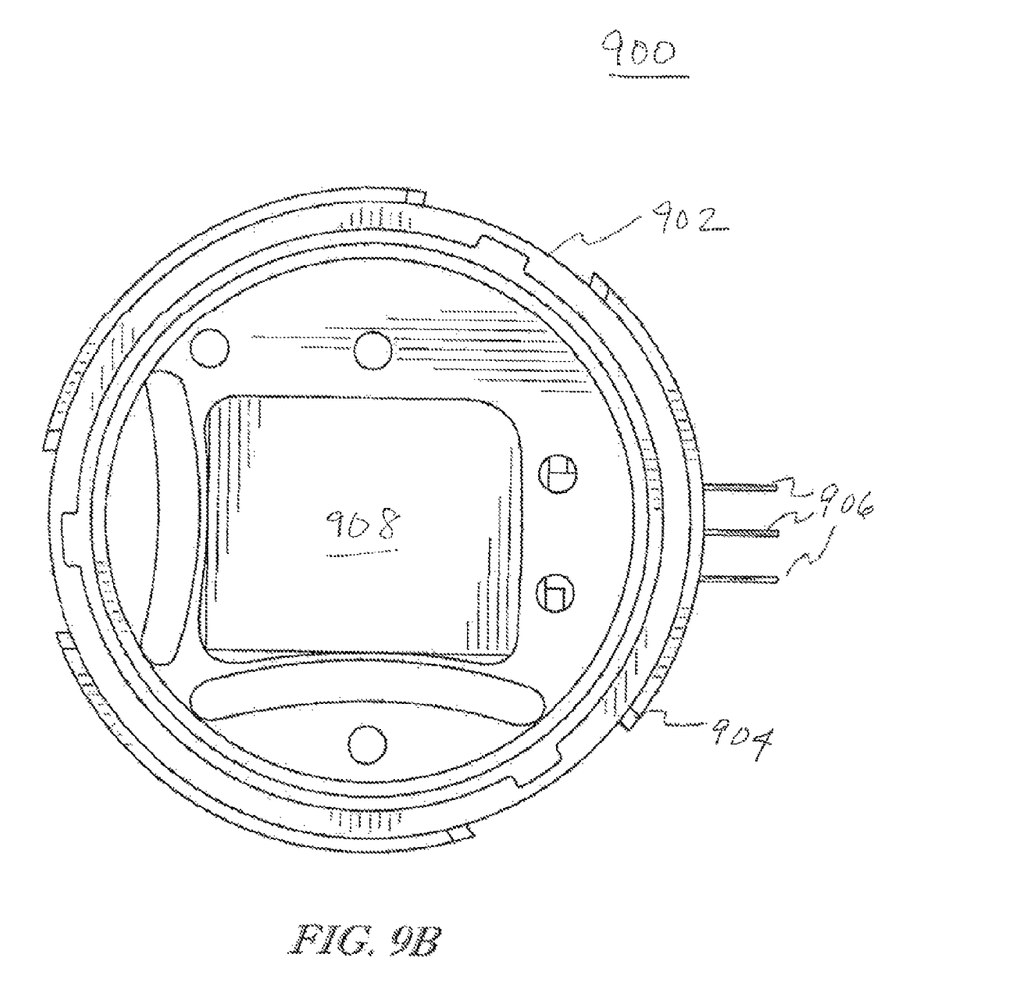
FIG. 9B illustrates an embodiment of an SMT fiber management tray.

FIGS. 9A and 9B illustrate an exemplary tray 900 having a foam ring guard 902 for placement into the fiber guide 904 of the tray 900. For example, the fibers 906 of a device 908 within the tray 900 may be routed into the fiber guide 904 of the tray 900, and then temporarily fixed therein with the foam ring 902 to secure and protect the fibers 906 in the guide 904 during SMT processes. Such an embodiment may be employed for automation. By way of example, fibers 906 may be routed into the fiber guide 904 of the tray 900 using a spinning machine, wherein both the fiber tray 900 and the optoelectronic device 908 are held by a spindle on the spinning machine, and the fibers 906 are guided into the guide 904 and then spun into the guide 904 before being fixed therein by the foam ring 902.

Figure 10A:
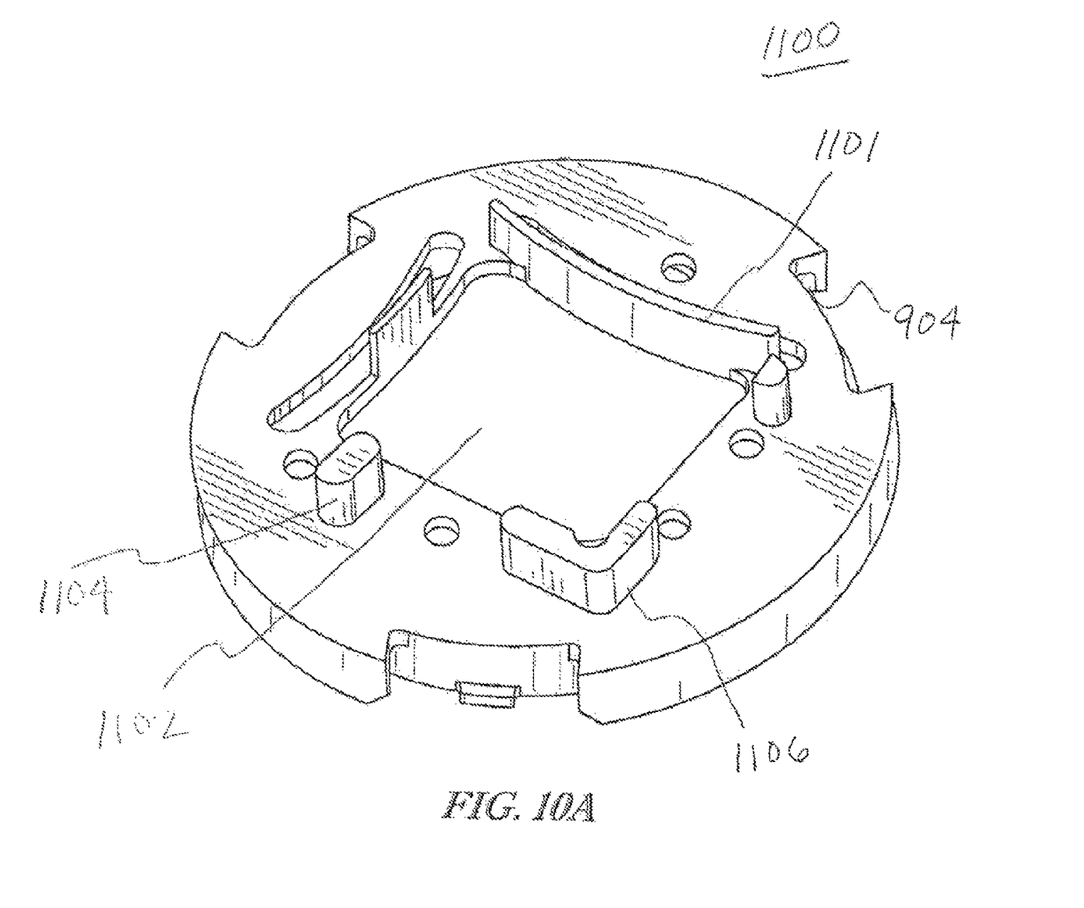
FIG. 10A illustrates an embodiment of an SMT fiber management tray.
Figure 10B:
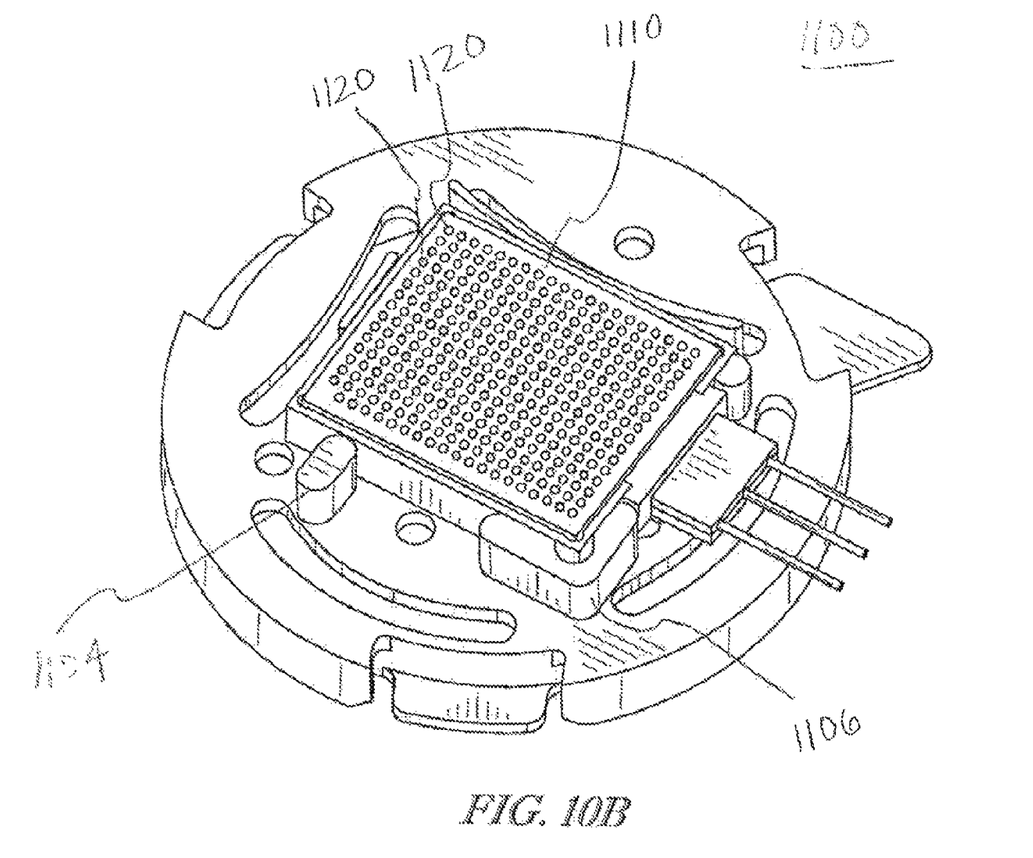
FIG. 10B illustrates an embodiment of an SMT fiber management tray.
Figure 10C:
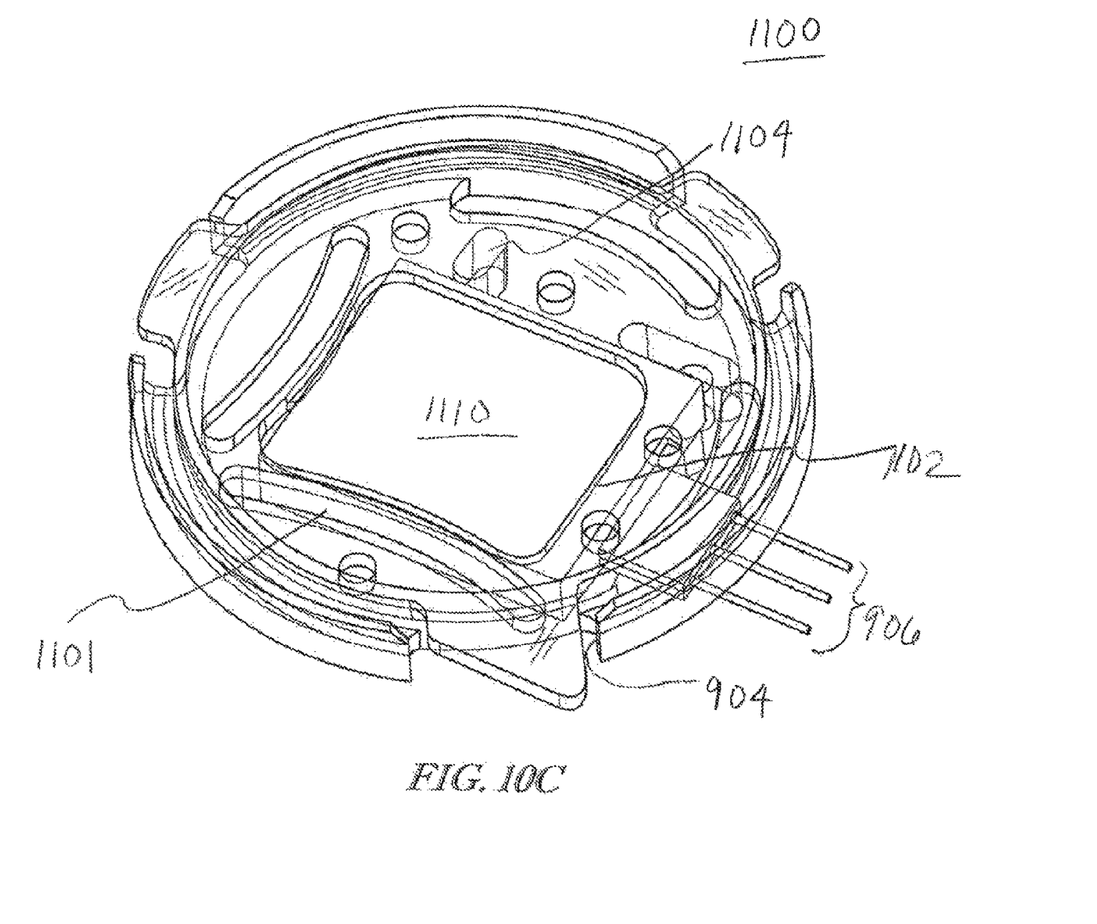
FIG. 10C illustrates an embodiment of an SMT fiber management tray.

FIGS. 10A, 10B and 10C illustrate additional aspects of embodiments. More particularly, FIG. 10A illustrates a tray 1100 having spring walls 1101, and an opening 1102 therein that allows for direct grasping, such as by a pick and placement tool head, of a device placed within the tray 1100. Of course, pressure applied through opening 1102 might also allow for displacement of a device within the tray 1100, such as by a gentle downward pressure on the device through the opening by a pick and place tool head, and a slight upward pressure on one or more perimeter aspects of tray 1100. The foregoing alleviates uneven placement of the device if picked up with the tray 1100, and disturbing of the evenness of the device upon removal of the tray 1100. Furthermore, issues of unevenness of the tray 1100, and non-ideal grasping surfaces of the tray 1100, are alleviated by this embodiment, at least in that the pick up tool head may grasp the device itself directly, and thereby may maintain the level nature of the device before and upon placement. This, of course, provides better reflow soldering quality, among other advantages.

FIG. 10A also illustrates stops 1104 and corners 1106 along the edges of the opening 1102. These stops 1104 and corners 1106 may serve to automatically stop and align the device and/or its solder joints when it is placed into the tray 1100, and may further level the device relative to the bottom of the tray 1100.

FIG. 10B illustrates the placement of device 1110 into the tray 1100, and the use of the corners 1106 and stops 1104 to stop and level the device 1110 within the tray 1100. In addition to leveling the device 1110, also illustrated is the leveling of the solder balls 1120 associated with the device 1110.

It will be appreciated, in light of the discussion herein, that the posts and spring walls may provide a modularity to the tray. That is, spring walls and posts may be variously located to accommodate several different shapes or sizes of device within the tray without post-manufacturing modification of the tray. Further, tray modularity may additionally include an allowance for devices to be attached into the tray with pins facing out of or into the inset.

Yet further, variability and/or modularity of trays my also include spring walls of different spring forces, i.e., spring walls may have greater or lower spring forces, may be smaller or larger, etc. Such variations may make the tray detachment forces higher or lower, depending on the needs of the embodiments, and/or may allow for different detachment forces for a given device or devices dependent upon whether the detachment is to be manual or automatic for a given process.

Needless to say, such variability in spring wall forces may also allow for variability in loading of devices into trays. For example, loading of devices into trays may be manual or automated, and acceptable forces may differ dependent upon the loading techniques used.

In the foregoing Detailed Description, it can be seen that various features are grouped together in a single embodiment for the purpose of clarity and brevity of the disclosure. This method of disclosure is not to be interpreted as reflecting an intention that the embodiments require more features than are expressly recited herein. Rather, the disclosure is to encompass all variations and modifications to the disclosed embodiments that would be understood to the skilled artisan in light of the disclosure.

What is claimed is:

1. A tray suitable for holding an optoelectronic device during printed circuit board manufacturing processes, comprising:
   a tray body having an inset for receiving the optoelectronic device;
   a plurality of positioners for the optoelectronic device within the inset, configured to engage a portion of an outer periphery of the optoelectronic device; and
   a guide channel about a perimeter of the tray body suitable for receiving optical fibers of the optoelectronic device when the optoelectronic device is received in the inset, the guide channel comprising at least one retainer for retaining received ones of the optical fibers therewithin.

2. The tray of claim 1, wherein the at least one retainer comprises at least one clip for closing the optical fibers within the guide channel.

3. The tray of claim 2, wherein the at least one clip is passive.

4. The tray of claim 2, wherein the at least one clip comprises three clips.

5. The tray of claim 2, wherein at least one of the at least one clip is oversized to provide additional retention.

6. The tray of claim 1, wherein the manufacturing process comprises solder reflow.

7. The tray of claim 1, wherein the positioners comprise spring walls of the inset.

8. The tray of claim 7, wherein the optoelectronic device comes detached from the tray upon exertion of a force greater than a spring force of the spring walls on the optoelectronic device.

9. The tray of claim 1, wherein the positioners comprises one of springs and frictional bumps in the inset.

10. The tray of claim 9, wherein the frictional bumps comprise microbumps.

11. The tray of claim 1, wherein the positioners comprise a plurality of positioning posts in the inset.

12. The tray of claim 1, wherein the positioners are frictional and engage at least three portions of the outer periphery of the optoelectronic device.

13. The tray of claim 1, wherein the inset further comprises air circulation vents to provide air circulation around the optoelectronic device to heat from the manufacturing processes.

14. The tray of claim 13, wherein the air circulation vents are on retaining walls of the inset.

15. The tray of claim 13, wherein the air circulation vents comprise cutouts on the tray body.

16. The tray of claim 1, wherein the guide channel comprises a plurality of entry points for receiving of the optical fibers.

17. The tray of claim 1, wherein a composition of the tray is a photopolymer resin.

18. The tray of claim 1, wherein a composition of the tray comprises a thermal deflection point of 150 degrees C. to 375 degrees C.

19. The tray of claim 1, wherein a composition of the tray comprises a thermal expansion coefficient in a range of 50-125 ppm.

20. The tray of claim 1, further comprising a pickup point that enables a toolhead to grasp the optoelectronic device through the tray body, wherein the pickup point comprises at least a device stop.

* * * * *